(12) United States Patent
Yuan et al.

(10) Patent No.: US 6,590,639 B1
(45) Date of Patent: Jul. 8, 2003

(54) ACTIVE VIBRATION ISOLATION SYSTEM HAVING PRESSURE CONTROL

(75) Inventors: Bausan Yuan, San Jose, CA (US); Michael Binnard, Belmont, CA (US); Martin Lee, Saratoga, CA (US)

(73) Assignee: Nikon Corporation, Tokyo (JP)

( * ) Notice: Subject to any disclaimer, the term of this patent is extended or adjusted under 35 U.S.C. 154(b) by 2 days.

(21) Appl. No.: 09/663,184

(22) Filed: Sep. 15, 2000

(51) Int. Cl.[7] .................. G03B 27/62; G03B 27/42; F16M 1/00; F16M 13/00
(52) U.S. Cl. .................. 355/75; 355/53; 267/136; 248/550
(58) Field of Search .................. 355/75, 53; 406/34; 267/136; 248/550

(56) References Cited

U.S. PATENT DOCUMENTS

| 4,821,205 A | 4/1989 | Schutten et al. |
| 6,170,622 B1 * | 1/2001 | Wakui et al. ............... 188/378 |

FOREIGN PATENT DOCUMENTS

| WO | WO 99/22272 | 5/1999 |

OTHER PUBLICATIONS

Hung V. Vu et al., "Pneumatic Vibration Isolation of a Table Traversed by a Moving Load," ASME, Vibration Isolation, Acoustics, and Damping in Mechanical Systems, DE–vol. 62, pp. 39–42 (1993).

D. B. Debra, "Vibration Isolation of Precision Machine Tools and Instruments," Annals of the C.I.R.P., vol. 41/2, pp. 711–718 (1992).

* cited by examiner

Primary Examiner—Russell Adams
Assistant Examiner—Peter B. Kim

(57) ABSTRACT

An active vibration isolation system includes a pneumatic control system and an electronic control system. The pneumatic control system supports a mass sensitive to vibration and isolates the mass from high frequency external disturbances. The electronic control system isolates the mass from low frequency external disturbances. The pneumatic control system includes a compliance chamber filled with a fluid to pneumatically support the mass, apparatus for directly measuring a pressure level in the compliance chamber, and apparatus for controlling the pressure level to minimize the effects of pressure variation in the compliance chamber. The measuring apparatus includes an instrument to measure an absolute pressure level of the compliance chamber or an instrument to measure a differential pressure level between the compliance chamber and a reference chamber having a predetermined pressure level.

29 Claims, 9 Drawing Sheets

ACTIVE VIBRATION ISOLATION SYSTEM HAVING PRESSURE CONTROL

BACKGROUND OF THE INVENTION

1. Field of the Invention

This invention relates to an active vibration isolation system (AVIS). Particularly, this invention relates to an AVIS having a direct pressure control on a pneumatic control system of the AVIS to isolate a mass from external disturbances, such as vibration. The AVIS is generally for use in a photolithography process.

2. Description of the Related Art

Photolithography is a process for manufacturing integrated circuits. In a photolithography process, light is transmitted through non-opaque portions of a pattern on a reticle, or photomask, through a projection exposure apparatus, and onto a wafer of specially-coated silicon or other semiconductor material. The uncovered portions of the coating, that are exposed to light, are cured. The uncured coating is then removed by an acid bath. The layer of uncovered silicon is altered to produce one layer of a multi-layered integrated circuit. Conventional systems use visible and ultraviolet light for this process. Recently, however, visible and ultraviolet light have been replaced with electron, X-ray, and laser beams, which permit smaller feature sizes in the patterns.

As the miniaturization of a circuit pattern progresses, the focus depth of the projection exposure apparatus becomes very small. More importantly, it is difficult to accurately align the overlay of circuit patterns of the multi-layered integrated circuit. As a result, a primary consideration for an overall design of the photolithography system includes building components of the system that achieve precision by maintaining small tolerances. Any vibration, distortion, or misalignment caused by external disturbances must be kept at minimum. These external disturbances affecting an individual part collectively alter the focusing properties of the photolithography system.

It has been proposed to provide an active vibration isolation system (AVIS). A conventional AVIS generally includes a pneumatic control system and an electronic control system. The pneumatic control system is capable of generating a large force, but has slow dynamics so that it cannot respond to high frequency disturbances or variations. Hence, the pneumatic control system supports a mass and is used to counteract low frequency internal disturbances and isolate the mass from high frequency ground vibration. The electronic control system compensates for any disturbance that the pneumatic control system does not sufficiently isolate, i.e., low frequency ground vibration and internal disturbances. In a lithography system, the mass may be a stage device and may be supported and isolated by a plurality of AVIS. In addition, more electronic control systems, operating in a horizontal direction, may be provided to isolate the mass from horizontal disturbances.

A conventional AVIS 100 is illustrated in FIGS. 1 and 2 having a pneumatic control system 102, shown in FIG. 1, and electronic control system 104, shown in FIG. 2. Pneumatic control system 102 includes a fluid-filled chamber 110 pressurized to support a mass 120. Mass 120 may represent an individual part, such as a stage device for holding the wafer, or may also represent the whole photolithography system. Pressurized chamber 110, generally known as a compliance chamber, acts like an air spring, while mass 120 acts like a piston compressing the fluid when the ground moves up and down or when mass 120 is disturbed or moves. To isolate mass 120 from vibration of the floor, the pressure inside compliance chamber 110 is preferably maintained at a level which counteracts the force of gravity on mass 120.

A damping system 130 is introduced into pneumatic control system 102 to minimize the movement of mass 120 as it rides on the air spring by allowing the fluid in compliance chamber 110 to pass through some type of resistance or restriction 132 into a damping chamber 134. The energy dissipated in restriction 132 provides damping of the natural behavior of mass 120 on the air spring. For optimal damping performance, damping chamber 134 may generally need to be as much as eight times the volume of compliance chamber 110.

In one embodiment, restriction 132 is a small hose connecting compliance chamber 110 to damping chamber 134. Alternatively, compliance chamber 110 and damping chamber 134 may be constructed of a single large chamber (not shown) with a wall dividing therebetween, the wall having a small hole acting as the restriction. Damping chamber 134 may be connected to a fluid supply 136 via a regulator 138, which controls the flow of fluid coming into or out of damping chamber 134. Controlling the flow adjusts the pressure level in damping chamber 134, which in turn stabilizes the pressure level in compliance chamber 110.

The electronic control system 104 shown in FIG. 2 includes an electronic actuator 150 connected to a motion sensor. The motion sensor generally includes a position sensor 152 and a velocity sensor 154. Position sensor 152 measures and provides a position error signal 156, while velocity sensor 154 measures and provides a velocity error signal 158 of the isolated mass 120. In the embodiment of FIG. 2, mass 120 is a base 124 over which a stage device 122 moves. Position and velocity error signals 156, 158, respectively, enter one or more feedback controllers. The embodiment of FIG. 2 shows a first feedback controller 160 receiving position error signal 156 and a second feedback controller 162 receiving velocity error signal 158. First and second feedback controllers 160, 162, respectively, in turn generate force signals 164, 166, which are used to isolate mass 120.

Electronic actuator 150 is also connected to a controller (not shown), such as a computer simulating a mathematical model, via a feedforward controller 172 to determine a calculated force signal 168, which is also used to isolate mass 120. A summing junction 174 calculates the difference between measured force signals 164, 166, and calculated force signal 168, and delivers the resulting signal 170 to electronic actuator 150. Electronic actuator 150 generates a force 176 corresponding to resulting signal 170, which is exerted on mass 120 to isolate it from disturbances that pneumatic control system 102 does not sufficiently isolate.

One problem with this conventional AVIS is that regulator 138 only indirectly controls compliance chamber 110 by controlling the fluid pressure in damping chamber 134. In the indirect control of compliance chamber 110, the control is influenced by a loss of the fluid between a measurement point (not shown) and compliance chamber 110. In addition, it is difficult to use a position information of mass 120 to control the pressure level in compliance chamber 110 since the relationship between the pressure level and the position information is not in exact proportion. Therefore, there is a need for an improved pneumatic control system whereby a direct control over the system is provided to better isolate the mass from external disturbances.

SUMMARY OF THE INVENTION

The advantages and purposes of the invention will be set forth in part in the description which follows, and in part will be obvious from the description, or may be learned by practice of the invention. The advantages and purposes of the invention will be realized and attained by the elements and combinations particularly pointed out in the appended claims.

To attain the advantages and in accordance with the purposes of the invention, as embodied and broadly described herein, a first aspect of the present invention is a pneumatic control system to support a mass in a vibration isolation system. The pneumatic control system comprises a compliance chamber filled with a fluid to pneumatically support the mass, the fluid having a fluctuating pressure level caused by external disturbances, and a sensor device connected to the compliance chamber for determining a pressure information of the compliance chamber by directly measuring the pressure level in the compliance chamber. The pneumatic control system also comprises a controller connected to the sensor device for controlling the pressure level in the compliance chamber in response to the pressure information to minimize the effects of fluctuating pressure level in the compliance chamber.

A second aspect of the present invention is a pneumatic control device to support a mass in a vibration isolation system. The pneumatic control device comprises a compliance chamber filled with a fluid to pneumatically support the mass, and a pressure sensor connected to the compliance chamber for measuring a pressure level in the compliance chamber and for outputting a pressure information of the compliance chamber. The pneumatic control device also comprises a feedback control system connected to the pressure sensor for receiving the pressure information and generating a feedback control pressure signal, and a pressure control actuator connected to the compliance chamber and the feedback control system for controlling the pressure level in the compliance chamber in response to the feedback control pressure signal.

A third aspect of the present invention is a pneumatic control device to support a mass in a vibration isolation system. The pneumatic control device comprises a compliance chamber filled with a fluid pneumatically supporting the mass, the fluid having a fluctuating pressure level due to vibration of the mass, and a reference chamber filled with the fluid having a predetermined pressure level. The pneumatic control device also comprises a differential pressure sensor connecting the compliance chamber to the reference chamber, and measuring a differential pressure level between the compliance chamber and the reference chamber. Further, the differential pressure level is used to control the fluctuating pressure level in the compliance chamber so that the fluctuating pressure level is substantially eliminated.

A fourth aspect of the present invention is a vibration isolation system comprising a pneumatic control device and an electronic control device. The pneumatic control device provides a pneumatic support to a mass and isolates the mass from high frequency external disturbances. The pneumatic control device has a pressure sensor and a first feedback control system connected to the pressure sensor. The pressure sensor measures a pressure level in a compliance chamber and generates a pressure information of the compliance chamber. The first feedback control system adjusts the pressure level in the compliance chamber based on the pressure information so that the pressure level equals a desired value. The electronic control device isolates the mass from at least one of low frequency external disturbances and high frequency internal disturbances. The electronic control device has a motion sensor, an electronic actuator, and a second feedback control system. The motion sensor detects a motion information of the mass caused by the at least one of the external disturbances and internal disturbances. The second feedback control system is connected to the motion sensor and generates a force signal to control the electronic actuator. The electronic actuator is connected to the second feedback control system and exerts a force corresponding to the force signal onto the mass to counteract the at least one of the external disturbances and the internal disturbances.

A fifth aspect of the present invention is a vibration isolation system, comprising a pneumatic control device and an electronic control device. The pneumatic control device provides a pneumatic support to a mass and isolates the mass from high frequency external disturbances. The pneumatic control device has a differential pressure sensor connected to a compliance chamber and a reference chamber. The differential pressure sensor measures a differential pressure level between the compliance chamber and the reference chamber to control a pressure level in the compliance chamber. The electronic control device isolates the mass from at least one of low frequency external disturbances and high frequency internal disturbances. The electronic control device has a motion sensor, an electronic actuator, and a feedback control system. The motion sensor detects a motion information of the mass caused by the at least one of the external disturbances and internal disturbances. The feedback control system is connected to the motion sensor and generates a force signal to control the electronic actuator. The electronic actuator is connected to the feedback control system and exerts a force corresponding to the force signal onto the mass to counteract the at least one of the external disturbances and the internal disturbances.

A sixth aspect of the present invention is a method for pneumatically controlling vibration of a mass caused by external disturbances, the mass being pneumatically supported by a compliance chamber. The method comprising the steps of directly measuring a pressure level in the compliance chamber, and controlling the pressure level to minimize the effects of fluctuating pressure level in the compliance chamber.

A further aspect of the present invention is a lithography system comprising a pneumatic control system or a vibration isolation system as summarized in the above aspects of the invention.

It is to be understood that both the foregoing general description and the following detailed description are exemplary and explanatory only and are not restrictive of the invention as claimed. Additional advantages will be set forth in the description which follows, and in part will be understood from the description, or may be learned by practice of the invention. The advantages and purposes may be obtained by means of the combinations set forth in the attached claims.

BRIEF DESCRIPTION OF THE DRAWINGS

The accompanying drawings, which are incorporated in and constitute a part of this specification, illustrate several embodiments of the invention and, together with the description, serve to explain the principles of the invention. In the drawings.

DESCRIPTION OF THE INVENTION

Reference will now be made in detail to several embodiments of systems, devices, and methods consistent with principles of the invention, examples of which are illustrated in the accompanying drawings. The invention will be further clarified by the following examples, which are intended to be exemplary of the invention.

A pneumatic control device of an AVIS consistent with the principles of this invention is useful to isolate a system sensitive to vibration. The system may be an individual part, a group of parts, or even the system as a whole. For example the system may be a stage device, a projection exposure apparatus, or a photolithography system. This invention, however, is not limited to any particular application. Rather, the devices and systems disclosed herein could be used in any system requiring vibration isolation.

Consistent with the principles of the present invention, an active vibration isolation system includes a pneumatic control system and may also include an electronic control system. The pneumatic control system includes a compliance chamber filled with a fluid to pneumatically support a mass, means for directly measuring a pressure level in the compliance chamber, and means for controlling the pressure level to minimize the effects of pressure variation in the compliance chamber.

Figure 3:
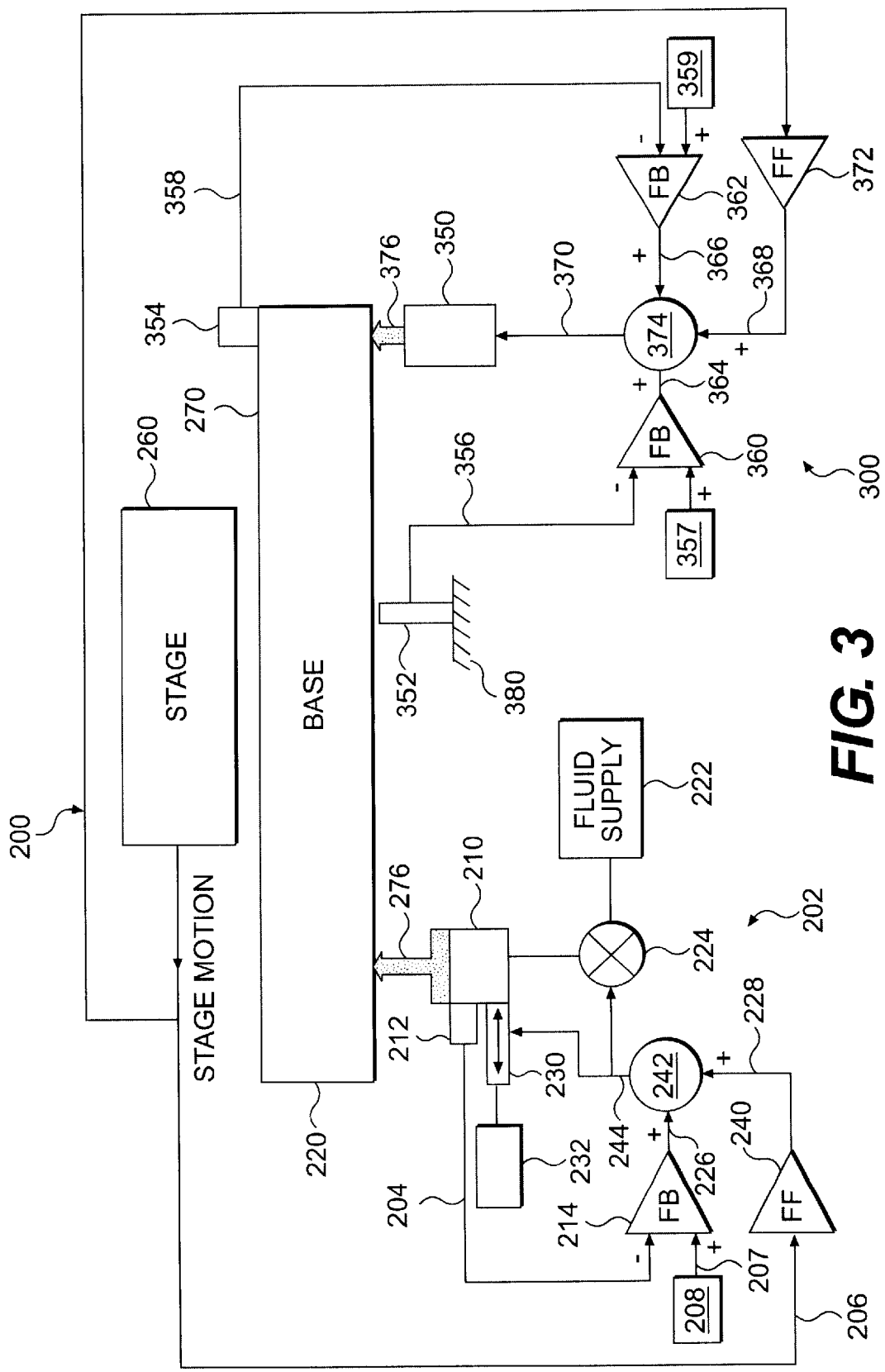
FIG. 3 is a schematic view of a first embodiment of an active vibration isolation system consistent with the principles of the present invention.
Figure 4:
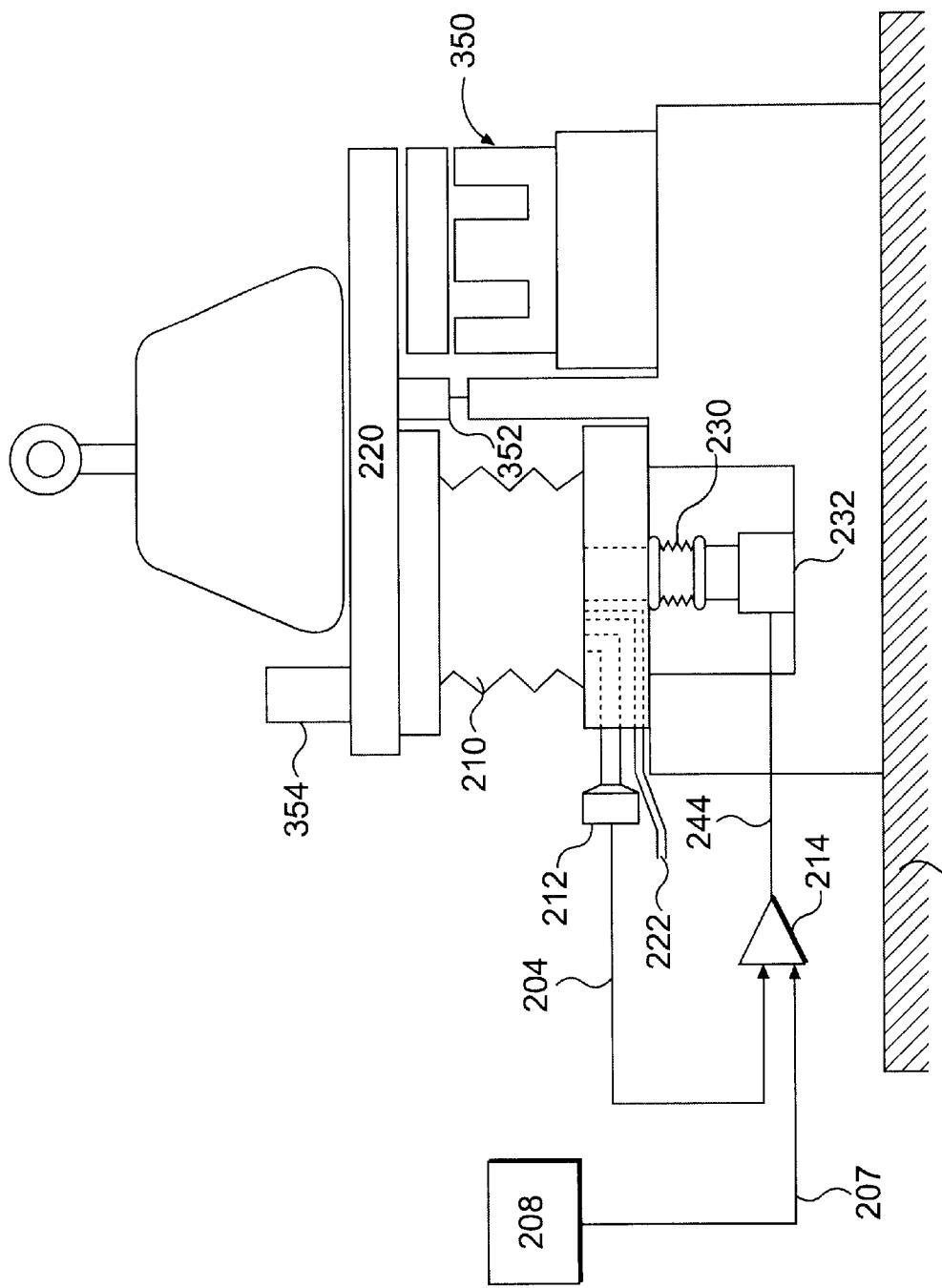
FIG. 4 is a schematic side view of the first embodiment of the active vibration isolation system consistent with the principles of the present invention.

FIGS. 3 and 4 schematically illustrate one embodiment of a pneumatic control device 202 of an active vibration isolation system 200 to isolate a mass 220 from high frequency external disturbances. Pneumatic control device 202 includes a compliance chamber 210 filled with a fluid pneumatically supporting mass 220. A pressure sensor 212 connected to compliance chamber 210 measures a pressure level therein to generate pressure level signal 204. Pressure level signal 204 of compliance chamber 210 is proportionate to a pneumatic force 276 (see also FIG. 6B) supporting mass 220. Mass 220 is illustrated to represent a combination of a stage 260 and a base 270. In an exposure apparatus 21 shown in FIG. 6A, stage 260 may include a reticle stage 76, a reticle 80, a wafer stage 66, and a wafer 68; while mass 220 may include apparatus frame 72, lens assembly 78, illumination system 74, a plurality of motors 10.

A feedback control system 214 receives measured pressure level signal 204 and reference signal 207, and provides a feedback control pressure signal 226. A computer or controller 208 may be provided to calculate and generate reference signal 207. A pressure control actuator is connected between compliance chamber 210 and feedback control system 214 and controls the pressure level of compliance chamber 210 so that the pressure level maintains a desired value which is substantially the same as reference signal 207 to counteract gravity and to cancel low frequency internal disturbances.

Also consistent with the principles of the present invention, the pressure control actuator of pneumatic control device 202 includes a fluid supply 222 and a supply regulator 224. Fluid supply 222 is connected to compliance chamber 210 via supply regulator 224 to control the amount of fluid flowing into or out of compliance chamber 210 in response to pressure level signal 244. In one embodiment, supply regulator 224 is an electropneumatic valve, such as a solenoid valve, a servovalve, or an electronic regulator. Such an electropneumatic valve is effective to control the fluid flowing in and out of compliance chamber 210, particularly when the fluid pressure has a large amplitude and a low frequency variation.

Alternatively or in addition to fluid supply 222 and supply regulator 224, the pressure control actuator of pneumatic control device 202 may include a mechanical actuator, like a bellows 230 or a piston (not shown), connected to compliance chamber 210. Bellows 230 acts to change the effective volume of compliance chamber 210 in response to pressure level signal 244. Bellows 230 is preferably connected to an actuator 232, such as an electromagnetic actuator, which controls the fluid when the fluid pressure has a small amplitude and a high frequency variation.

Figure 1:
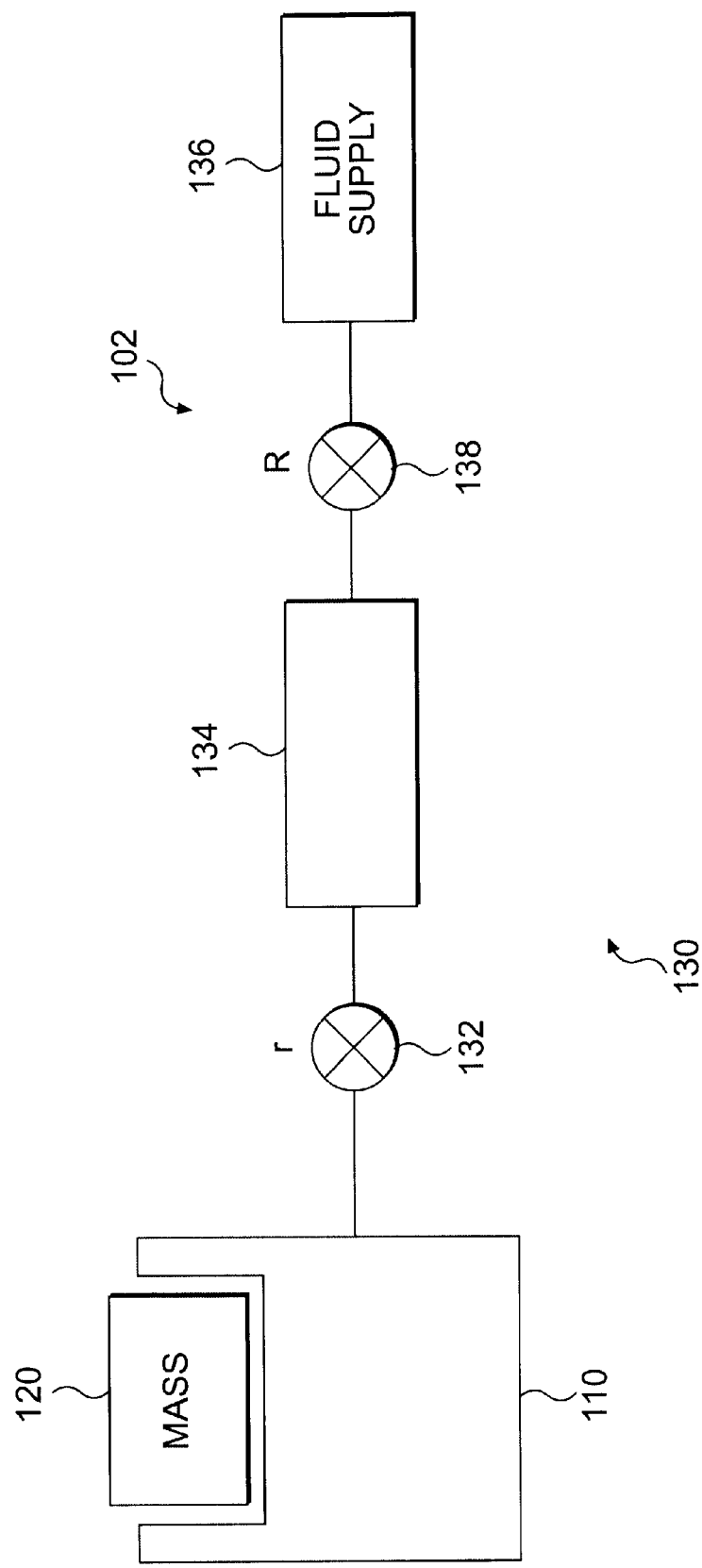
FIG. 1 is a schematic view of a pneumatic control system of a conventional active vibration isolation system.
Figure 2:
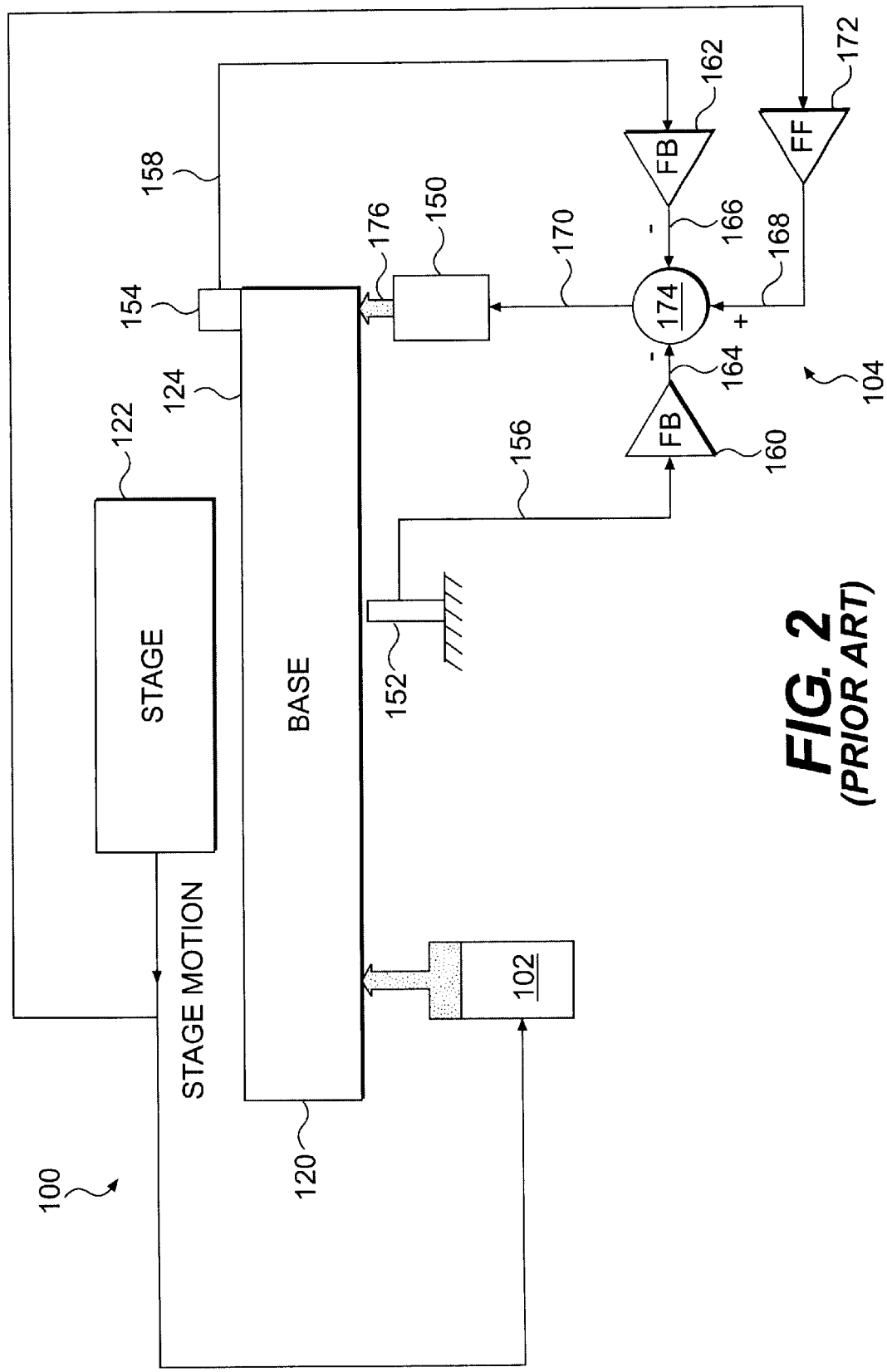
FIG. 2 is a schematic view of a conventional active vibration isolation system with an electronic control system.

In addition to the pressure control actuator according to the principles of the present invention, including, for example, fluid supply 222 and supply regulator 224, and/or bellows 230 and actuator 232, or any equivalence thereof, a conventional damping system (not shown), similar to the one discussed in the Description of Related Art and shown in FIG. 1, may be used with pneumatic control device 202. Alternatively, the pressure control actuator may dispose of the need for the conventional damping system to reduce cost, to build a more compact AVIS design, and to improve response time.

Further consistent with the principles of the present invention, pneumatic control device 202 includes a feedforward control system 240 which receives a motion signal 206 of compliance chamber 210 based on a position of a center of gravity of mass 220, and calculates pressure signal 228.

Pneumatic control device 202 also includes a summing junction 242 to calculate the sum of calculated pressure signal 228 from feedforward control system 240 and feedback control pressure signal 226 from feedback control system 214. Summing junction 242 generates a resulting pressure level signal 244. The pressure control actuator, fluid supply 222 with supply regulator 224 and/or bellows 230 with electromagnetic actuator 232 respond to pressure level signal 244 to control the pressure level of compliance chamber 210 so that pressure level closely follows reference signal 207.

FIG. 3 also illustrates an electronic control system 300 isolating mass 220 from low frequency external disturbances and high frequency internal disturbances. Electronic control system 300 includes a motion sensor, an electronic actuator 350, and a feedback control system. The motion sensor measures motion of mass 220 caused by the disturbances and generates a motion signal. The feedback control system, upon receiving the motion signal, generates a force signal 370 to control electronic actuator 350. Electronic actuator 350 exerts a force 376 corresponding to force signal 370 onto mass 220 to counteract the disturbances.

The motion sensor may be comprised of one or more elements. For example, the motion sensor may include a position sensor 352 as shown in FIGS. 3, 4, and 6B, to detect the position of mass 220 with respect to a reference point, for example, the ground 380, and to generate a position error signal 356. A position reference signal 357, representing a desired or calculated position of mass 220, may be provided based on a preset value or a computer generated signal. A first feedback control system 360 calculates the difference between position error signal 356 and position reference signal 357 and outputs a first force signal 364.

In addition, or alternatively, the motion sensor may include a velocity sensor 354, such as a geophone, to detect an absolute velocity of mass 220 caused by the external disturbances, and to generate an absolute velocity signal 358. A velocity reference signal 359, representing a desired or calculated velocity of mass 220, may be provided based on a preset value or a computer generated signal. A second feedback control system 362 calculates the difference between absolute velocity signal 358 and velocity reference signal 359 and outputs a second force signal 366.

First force signal 364 and second force signal 366 enter a summing junction 374 in which a resulting force signal 370 is calculated and delivered to electronic actuator 350. Electronic actuator 350 then exerts a force 376 corresponding to resulting force signal 370 onto mass 220 to compensate for positional drift of mass 220 with respect to reference point 380 and for vibration caused by internal or external disturbances. First force signal 364 is primarily used to compensate for the positional drift of mass 220 with respect to reference point 380. Second force signal 366 is primarily used to compensate for vibration caused by internal or external disturbances.

Electronic actuator 350 could be any device for exerting force, such as a motor, an electronic transducer, or the like. In one embodiment, an EI core transducer, as shown in FIG. 4, is used. An EI core transducer is an electromagnetic transducer which obtains its name because its shape resembles the letters "E" and "I", whereby magnetic fields circulate around the three legs of the E-core to exert force on the I-core.

Alternatively, velocity sensor 354 may be replaced by an acceleration sensor (not shown) to detect absolute acceleration of mass 220. Similar to velocity sensor 354, the absolute acceleration signal may be compared with an acceleration reference signal, and delivered to second feedback control system 362 to output a second force signal. Velocity sensor 354 has some advantages over the acceleration sensor because velocity sensors 354 are relatively cheaper, produce less noise at high frequencies, and directly measure the quantity being controlled, which is the absolute velocity of vibrating mass.220.

Furthermore, electronic control device 300 may include a feedforward control system 372 to generate a calculated force signal 368 which is used in exerting a force on mass 220 to compensate for known disturbances. Calculated force signal 368 may be calculated based on a computerized mathematical model of the AVIS 200, or of an isolated system of mass 220. Summing junction 374 calculates the sum of calculated force signal 368 from feedforward control system 372 and measured force signals 364, 366, from feedback control systems 360, 362, respectively. First force signal 364, second force signal 366, and a calculated force signals 368 enter summing junction 374 in which a resulting force signal 370 is calculated and delivered to electronic actuator 350. Electronic actuator 350 then exerts a force 376 (see also FIG. 6B) corresponding to resulting force signal 370 onto mass 220 to counteract the low frequency external disturbances and high frequency internal disturbances acting on the mass 220.

FIG. 4 schematically illustrates an embodiment of an AVIS using many of the elements shown and described with respect to FIG. 3. Additionally, controller 208, such as a computer simulating a mathematical model, is provided to determine reference pressure level 207. Compliance chamber 210 is shown to shape like a lift bellows, and is connected to a voice-coil motor (VCM) bellows 230 and a voice-coil motor (VCM) actuator 232. Feedback control system 214 is shown, while feedforward control system 240 is not shown in FIG. 4.

Figure 5:
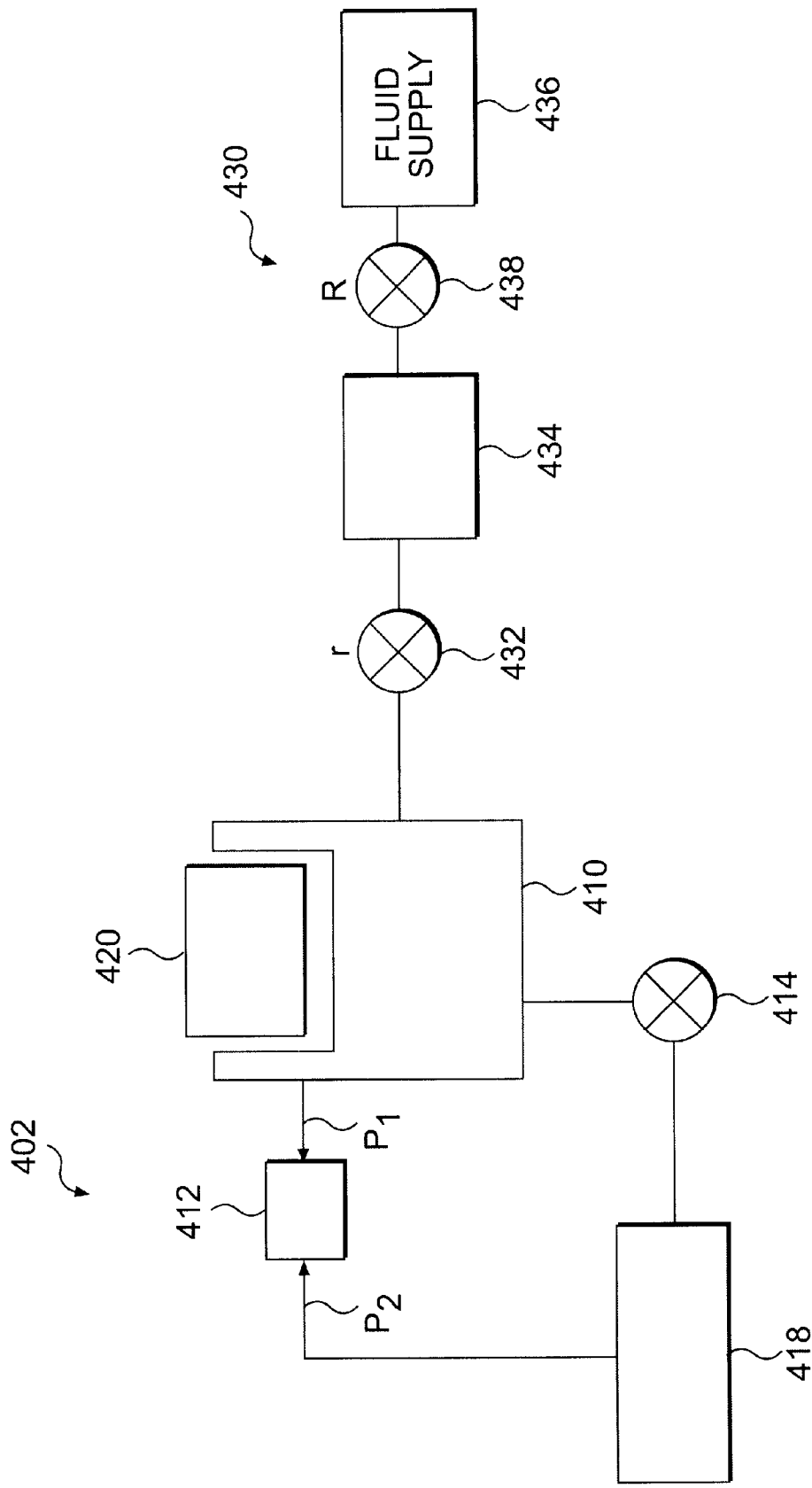
FIG. 5 is a schematic view of a second embodiment of an active vibration isolation system consistent with the principles of the present invention.

FIG. 5 schematically illustrates an AVIS having another embodiment of a pneumatic control device 402. In pneumatic control device 202 described above, pressure sensor 212 directly measures the absolute pressure level 204 of compliance chamber 210. In pneumatic control device, a differential pressure sensor 412 is introduced to directly measure the differential pressure level between a compliance chamber 410 and a reference chamber 418.

Pneumatic control device 402 includes a compliance chamber 410 filled with a fluid to pneumatically support mass 420. The fluid generally has a fluctuating pressure level $P_1$ due to the vibration of mass 420 or of the ground. Pressure P1 is measured by a differential pressure sensor 412, which connects compliance chamber 410 to a reference chamber 418. Reference chamber 418 is filled with fluid having a predetermined pressure level $P_2$. Differential pressure sensor 412 measures a differential pressure level ($P_1-P_2$) between compliance chamber 410 and reference chamber 418.

Further consistent with the principles of the present invention, pneumatic control device 402 includes a reference valve 414 connecting reference chamber 418 to compliance chamber 410. During an initiation procedure, reference valve 414 is open to stabilize the fluid pressure in compliance chamber 410 and reference chamber 418 at a predetermined pressure level. Thus, differential pressure sensor 412 should initially read zero because $P_1$ and $P_2$ are equal. During operation, reference valve 414 is closed.

The system of FIG. 5 may also use features consistent with the principles of the present invention described above. For example, the apparatus for controlling the pressure level in pneumatic control device 402 may be a feedback control system (not shown) which, upon receiving the measured differential pressure level ($P_1-P_2$), adjusts the pressure level in compliance chamber 410. Also, the apparatus for controlling the pressure level in compliance chamber 410 may include a pressure control actuator (not shown) connected between compliance chamber 410 and the feedback control system to control pressure level $P_1$ in compliance chamber 410, so that $P_1=P_2$.

Further consistent with the principles of the present invention, pneumatic control device 402 may include a feedforward control system (not shown) to calculate a desired pressure level $P_1$ of compliance chamber 410 based on a computer simulation or mathematical model. In this case, the control system will use the differential pressure signal ($P_1-P_2$) to control the pressure level $P_1$ to closely follow the desired value.

Likewise, pneumatic control device 402 may include a damping element 430 connecting compliance chamber 410 to a fluid supply 436, for controlling the fluid flowing into and out of compliance chamber 410 to maintain the desired pressure level $P_1$ in compliance chamber 410. Damping element 430 includes a damping chamber 434 filled with the fluid, a restriction 432, and a fluid supply regulator 438. Restriction 432 connects compliance chamber 410 to damping chamber 434 and controls the fluid flowing between compliance chamber 410 and damping chamber 434 so that the oscillating of pressure level in compliance chamber 410 is minimized. Fluid supply regulator 438 connects damping chamber 434 to fluid supply 436. Fluid supply regulator 438 controls the fluid flowing between damping chamber 434 and fluid supply 436 so that the fluctuating pressure level in compliance chamber 410 becomes constant, i.e., $P_1=P_2$.

In operation, the desired pressure level $P_1$ in compliance chamber 410 changes only a small amount from nominal value $P_2$. For example, desired pressure level $P_1$ may vary between 29 and 31 psi. In this case, the resolution of pneumatic control device 402 can be improved by using differential pressure sensor 412 to measure the differential pressure level $(P_1-P_2)$ between compliance chamber 410. Reference chamber 418 has a predetermined pressure level $P_2$, which, in this example, is held at a fixed pressure of 30 psi. Differential pressure sensor 412 with a range of ±1 psi or higher may be used, instead of pressure sensor 212 measuring absolute pressure level with a range of 31 psi or higher. Therefore, differential pressure sensor 412 with a smaller range offers a more precise measurement or resolution.

One advantage of the present invention is that the direct measurement of the compliance chamber pressure greatly reduces the effects of pressure fluctuation therein. The pneumatic feedback control system and the pressure control actuator improve the AVIS performance by isolating the system from ground vibration and by reducing the response time needed to stabilize the pressure level in the compliance chamber. Because the pressure level in the compliance chamber is accurately monitored and controlled, the pneumatic control system substantially improves the system isolation so that the size of and force produced by the electronic actuator of the electronic control system can be reduced, which in turn, reduces the heat generated by the electronic actuator.

Figure 6A:
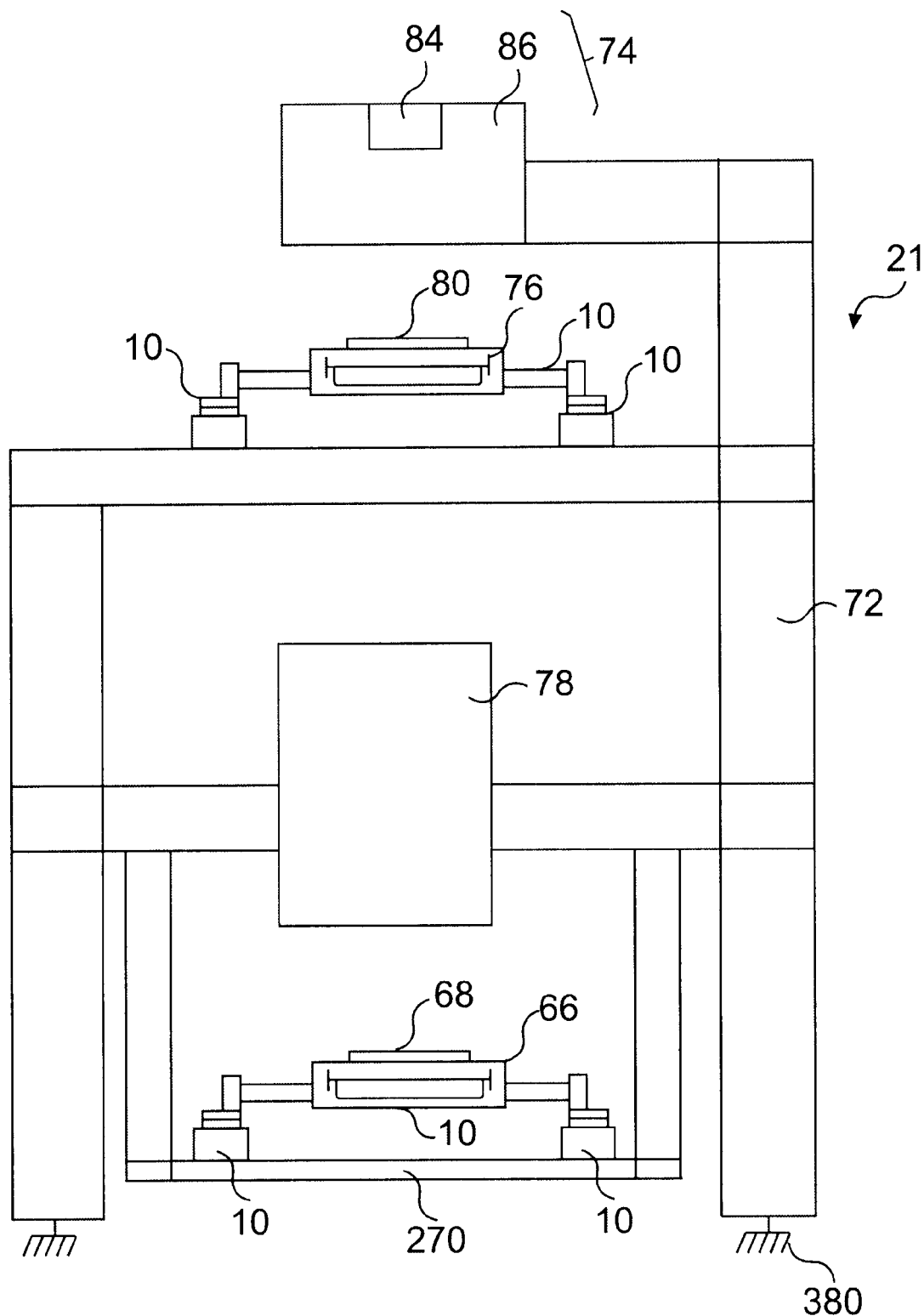
FIG. 6A is an elevation view of an exposure apparatus utilizing an AVIS having features of the present invention.
Figure 6B:
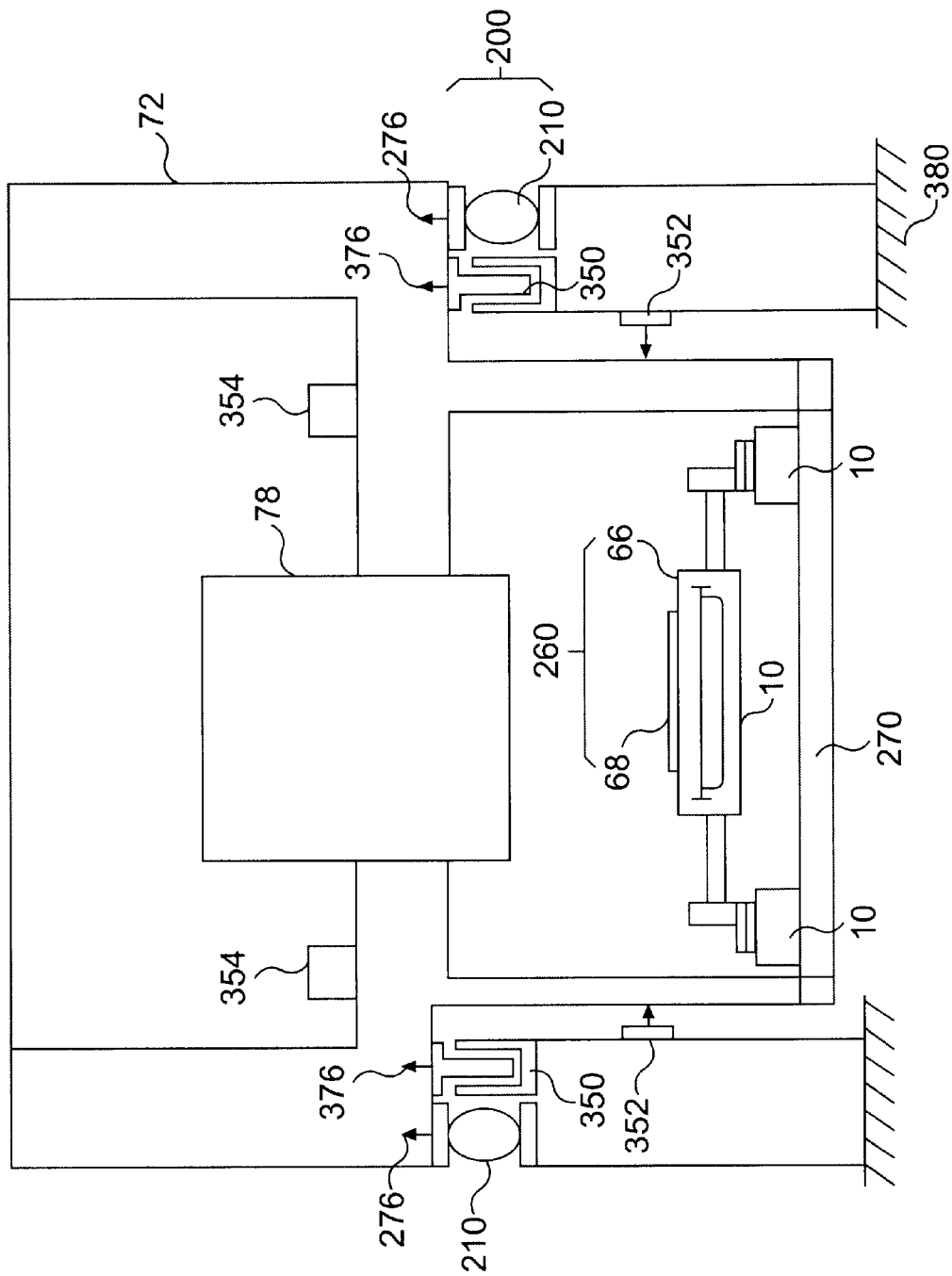
FIG. 6B is a detail view of a portion of the exposure apparatus show in FIG. 6A.

In operation, AVIS consistent with the principles of the present invention may be used in combination with an exposure apparatus 21, as shown in FIGS. 6A and 6B, to manufacture semiconductor devices according to a photolithographic process. Exposure apparatus 21 transfers a pattern of an integrated circuit from reticle 80 onto semiconductor wafer 68. Exposure apparatus 21 is mounted on a base 380, i.e., a floor or the ground or some other supporting structure.

Apparatus frame 72 is rigid and supports the components of the exposure apparatus 21. The design of the apparatus frame 72 can be varied to suit the design requirements for the rest of exposure apparatus 21. Apparatus frame 72 illustrated in FIG. 6, supports reticle stage 76, wafer stage 66, lens assembly 78, and illumination system 74 above base 64. Alternately, for example, separate, individual structures (not shown) can be used to support wafer stage 66 and reticle stage 76, illumination system 74, and lens assembly 78 above base 64.

Illumination system 74 includes an illumination source 84 and an illumination optical assembly 86. Illumination source 84 emits the beam (irradiation) of light energy. Illumination optical assembly 86 guides the beam of light energy from illumination source 84 to lens assembly 78. The beam illuminates selectively different portions of reticle 80 and exposes wafer 68. In FIG. 6A, illumination source 84 is illustrated as being supported above reticle stage 76. Typically, however, illumination source 84 is secured to one of the sides of apparatus frame 72 and the energy beam from illumination source 84 is directed to above reticle stage 76 with illumination optical assembly 86.

Lens assembly 78 projects and/or focuses the light passing through reticle 80 to wafer 68. Depending upon the design of apparatus 21, lens assembly 78 can magnify or reduce the image illuminated on reticle 80.

Reticle stage 76 holds and precisely positions reticle 80 relative to lens assembly 78 and wafer 68. Similarly, wafer stage 66 holds and positions wafer 68 with respect to the projected image of the illuminated portions of reticle 80. In the embodiment illustrated in FIGS. 6A and 6B, wafer stage 66 and reticle stage 76 are positioned by shaft-type linear motors 10. Depending upon the design, apparatus 21 can also include additional servo drive units, linear motors and planar motors to move wafer stage 66 and reticle stage 76.

There are a number of different types of lithographic devices. For example, exposure apparatus 21 can be used as a scanning type photolithography system which exposes the pattern from reticle 80 onto wafer 68 with reticle 80 and wafer 68 moving synchronously. In a scanning type lithographic device, reticle 80 is moved perpendicular to an optical axis of lens assembly 78 by reticle stage 76 and wafer 68 is moved perpendicular to an optical axis of lens assembly 78 by wafer stage 66. Scanning of reticle 80 and wafer 68 occurs while reticle 80 and wafer 68 are moving synchronously.

Alternatively, exposure apparatus 21 can be a step-and-repeat type photolithography system that exposes reticle 80 while reticle 80 and wafer 68 are stationary. In the step and repeat process, wafer 68 is in a constant position relative to reticle 80 and lens assembly 78 during the exposure of an individual field. Subsequently, between consecutive exposure steps, wafer 68 is consecutively moved by wafer stage 66 perpendicular to the optical axis of lens assembly 78 so that the next field of semiconductor wafer 68 is brought into position relative to lens assembly 78 and reticle 80 for exposure. Following this process, the images on reticle 80 are sequentially exposed onto the fields of wafer 68.

However, the use of exposure apparatus 21 provided herein is not limited to a photolithography system for semiconductor manufacturing. Exposure apparatus 21, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, machine tools, metal cutting machines, and inspection machines.

The illumination source 84 can be g-line (436 nm), i-line (365 nm), KrF excimer laser (248 nm), ArF excimer laser (193 nm) and $F_2$ laser (157 nm). Alternately, illumination source 84 can also use charged particle beams such as x-ray and electron beam. For instance, in the case where an electron beam is used, thermionic emission type lanthanum hexaboride ($LaB_6$) or tantalum (Ta) can be used as an electron gun. Furthermore, in the case where an electron beam is used, the structure could be such that either a mask is used or a pattern can be directly formed on a substrate without the use of a mask.

In terms of the magnification of lens assembly 78 included in the photolithography system, lens assembly 78 need not be limited to a reduction system. It could also be a 1× or magnification system.

With respect to lens assembly 78, when far ultra-violet rays such as the excimer laser is used, glass materials such as quartz and fluorite that transmit far ultra-violet rays is preferable to be used. When the $F_2$ type laser or x-ray is used, lens assembly 78 should preferably be either catadioptric or refractive (a reticle should also preferably be a reflective type), and when an electron beam is used, electron optics should preferably comprise electron lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No. 8-171054 published in the Official Gazette for Laid-Open Patent Applications and its counterpart U.S. Pat. No. 5,668,672, as well as Japan Patent Application Disclosure No.10-20195 and its counterpart U.S. Pat. No. 5,835,275. In these cases, the reflecting optical device can be a catadioptric optical system incorporating a beam splitter and concave mirror. Japan Patent Application Disclosure No.8-334695 published in the Official Gazette for Laid-Open Patent Applications and its counterpart U.S. Pat. No. 5,689,377 as wall as Japan Patent Application Disclosure No.10-3039 and its counterpart U.S. patent application Ser. No. 873,606 (Application Date: Jun. 12, 1997) also use a reflecting-refracting type of optical system incorporating a concave mirror, etc., but without a beam splitter, and can also be employed with this invention. The disclosures in the above-mentioned U.S. patents, as well as the Japan patent applications published in the Official Gazette for Laid-Open Patent Applications are incorporated herein by reference.

Further, in photolithography systems, when linear motors (see U.S. Pat. Nos. 5,623,853 or 5,528,118) are used in a wafer stage or a mask stage (reticle stage), the linear motors can be either an air levitation type employing air bearings or a magnetic levitation type using Lorentz force or reactance force. Additionally, the stage could move along a guide, or it could be a guideless type stage which uses no guide. The disclosures in U.S. Pat. Nos. 5,623,853 and 5,528,118 are incorporated herein by reference.

Alternatively, one of the stages could be driven by a planar motor, which drives the stage by electromagnetic force generated by a magnet unit having two-dimensionally arranged magnets and an armature coil unit having two-dimensionally arranged coils in facing positions. With this type of driving system, either one of the magnet unit or the armature coil unit is connected to the stage and the other unit is mounted on the moving plane side of the stage.

Movement of the stages as described above generates reaction forces which can affect performance of the photolithography system. Reaction forces generated by the wafer (substrate) stage motion can be mechanically released to the floor (ground) by use of a frame member as described in U.S. Pat. No. 5,528,118 and published Japanese Patent Application Disclosure No. 8-166475. Additionally, reaction forces generated by the reticle (mask) stage motion can be mechanically released to the floor (ground) by use of a frame member as described in U.S. Pat. No. 5,874,820 and published Japanese Patent Application Disclosure No. 8-330224. The disclosures in U.S. Pat. Nos. 5,528,118 and 5,874,820 and Japanese Patent Application Disclosure No. 8-330224 are incorporated herein by reference.

As described above, a photolithography system according to the above described embodiments can be built by assembling various subsystems, including each element listed in the appended claims, in such a manner that prescribed mechanical accuracy, electrical accuracy and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, total adjustment is performed to make sure that every accuracy is maintained in the complete photolithography system. Additionally, it is desirable to manufacture an exposure system in a clean room where the temperature and purity are controlled.

Figure 7:
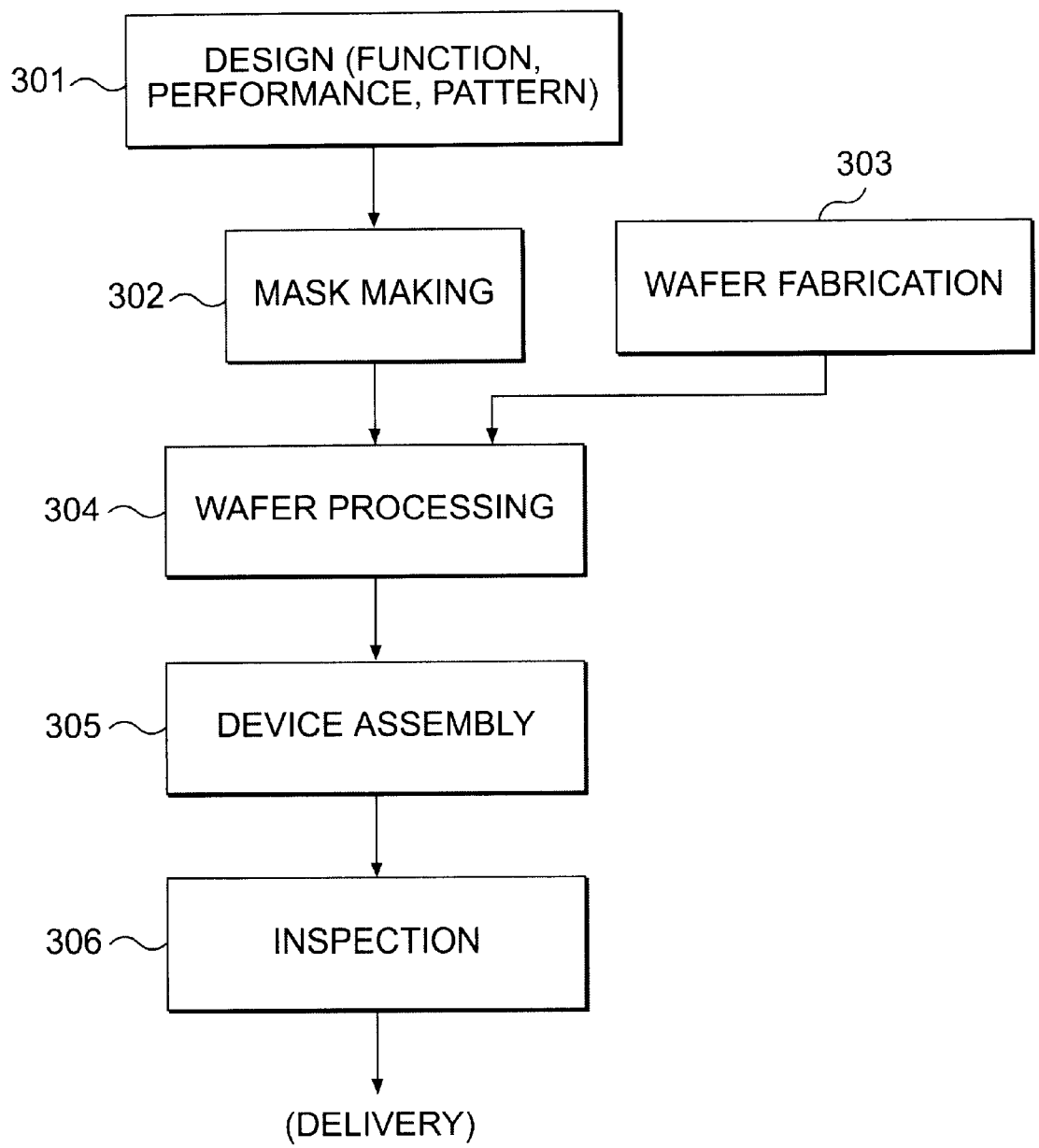
FIG. 7 is a flow chart outlining a process for manufacturing a semiconductor device consistent with the principles of the present invention.

Further, semiconductor devices can be fabricated using the above described systems, by the process shown generally in FIG. 7. In step 301 the device's function and performance characteristics are designed. Next, in step 302, a mask (reticle) having a pattern is designed according to the previous designing step, and in a parallel step 303 a wafer is made from a silicon material. The mask pattern designed in step 302 is exposed onto the wafer from step 303 in step 304 by a photolithography system described hereinabove in accordance with the present invention. In step 306 the semiconductor device is assembled (including the dicing process, bonding process and packaging process), then finally the device is inspected in step 306.

Figure 8:
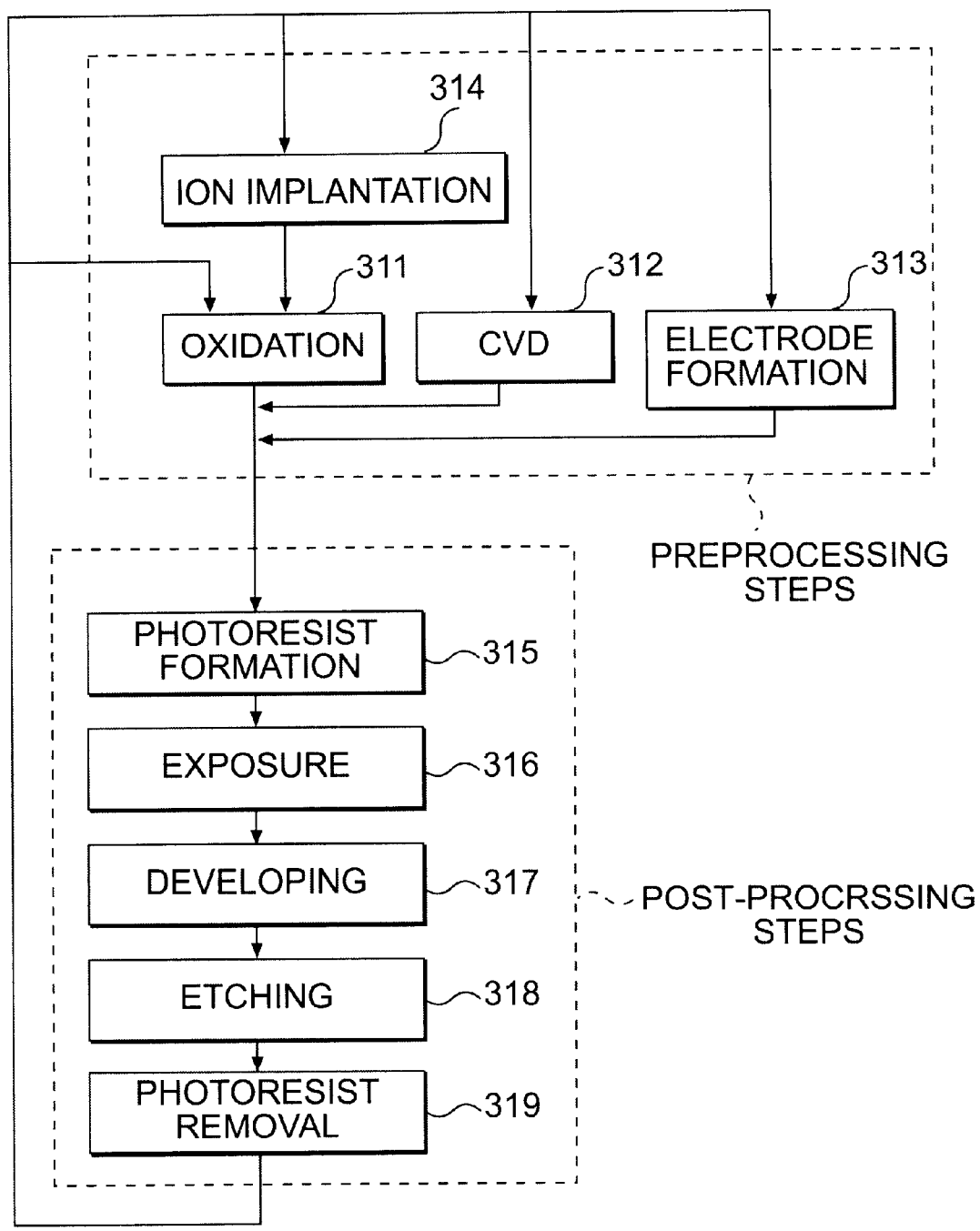
FIG. 8 is a flow chart outlining the process of FIG. 7 in further detail.

FIG. 8 illustrates a detailed flowchart example of the above-mentioned step 304 in the case of fabricating semiconductor devices. In step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted in the wafer. The above mentioned steps 311–314 form the processing steps for wafers during wafer processing, and selection is made at each step according to processing requirements.

At each stage of wafer processing, when the above-mentioned preprocessing steps have been completed, the following post-processing steps are implemented. During post-processing, initially, in step 315 (photoresist formation step), photoresist is applied to a wafer. Next, in step 316, (exposure step), the above-mentioned exposure device is used to transfer the circuit pattern of a mask (reticle) to a wafer. Then, in step 317 (developing step), the exposed wafer is developed, and in step 318 (etching step), parts other than residual photoresist (exposed material surface) are removed by etching. In step 319 (photoresist removal step), unnecessary photoresist remaining after etching is removed.

Multiple circuit patterns are formed by repetition of these preprocessing and post-processing steps.

It will be apparent to those skilled in the art that various modifications and variations can be made in the pneumatic control system, such as other means for directly measuring the pressure level in the compliance chamber, or other means for controlling the pressure level to minimize the effects of fluctuating pressure level in the compliance chamber. It will also be apparent that various modifications and variations can be made in the pressure control actuator, feedback control system, and feedforward control system, and in construction of the photolithography system as well as other aspect the invention without departing from scope or spirit of the invention.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims and their equivalents.

We claim:

1. A pneumatic control system to support a mass in a vibration isolation system, comprising:
    a compliance chamber filled with a fluid to pneumatically support the mass, the fluid having a fluctuating pressure level caused by external disturbances;
    a sensor device connected to the compliance chamber, the sensor device determining a pressure information of the compliance chamber by directly measuring the pressure level in the compliance chamber; and
    a controller connected to the sensor device, the controller controlling the pressure level in the compliance chamber in response to the pressure information to minimize the effects of fluctuating pressure level in the compliance chamber.

2. The pneumatic control system of claim 1, wherein the controller comprises:
    a feedback control system that generates a feedback control pressure signal based on the pressure information; and
    a pressure control actuator connected to the compliance chamber and the feedback control system, the pressure control actuator controlling the pressure level in the compliance chamber in response to the feedback control pressure signal so that the pressure level in the compliance chamber equals a desired value.

3. The pneumatic control system of claim 2, further comprising:
    a feedforward control system to determine a required pressure level of the compliance chamber as determined from a remote source; and
    a summing junction connected to the feedforward control system and the feedback control system, the summing junction calculating the sum of the required pressure level from the feedforward control system and the feedback control pressure signal from the feedback control system;
    wherein the pressure control actuator uses the summed pressure level to control the pressure level in the compliance chamber.

4. The pneumatic control system of claim 1, wherein the sensor device comprises:
    a reference chamber filled with fluid having a predetermined pressure level; and
    a differential pressure sensor connected between the compliance chamber and the reference chamber, the differential pressure sensor measuring a differential pressure level between the compliance chamber and the reference chamber.

5. The pneumatic control system of claim 4, wherein the sensor device further comprises:
    a reference valve connected between the reference chamber and the compliance chamber, the reference valve being open during initiation to equalize the fluid pressure in the pneumatic control system, and being closed during operation.

6. A lithography system comprising a pneumatic control system as claimed in claim 1.

7. An object on which an image has been formed by the lithography system of claim 6.

8. A pneumatic control device to support a mass in a vibration isolation system, comprising:
    a compliance chamber filled with a fluid to pneumatically support the mass;
    a pressure sensor connected to the compliance chamber, the pressure sensor measuring a pressure level in the compliance chamber and for outputting a pressure information of the compliance chamber;
    a feedback control system connected to the pressure sensor, the feedback control system receiving the pressure information and generating a feedback control pressure signal; and
    a pressure control actuator connected to the compliance chamber and the feedback control system, the pressure control actuator controlling the pressure level in the compliance chamber in response to the feedback control pressure signal,
    wherein the pressure control actuator comprises a fluid supply connected to the compliance chamber via a regulator that controls the amount of fluid flowing into and out of the compliance chamber in response to the pressure information of the compliance chamber, and
    wherein the regulator is an electropneumatic valve to control the fluid when the fluid pressure has a large amplitude and a low frequency variation.

9. A lithography system comprising a pneumatic control device as claimed in claim 8.

10. An object on which an image has been formed by the lithography system of claim 9.

11. The pneumatic control device of claim 8, wherein the pressure control actuator comprises:
    one of a bellows and a piston connected to the compliance chamber.

12. The pneumatic control device of claim 11, wherein the one of a bellows and a piston is connected to an electromagnetic actuator, the one of a bellows and a piston controlling a volume of the compliance chamber when the fluid pressure has a small amplitude and a high frequency variation.

13. The pneumatic control device of claim 8, further comprising:
    a feedforward control system that determines a required pressure level of the compliance chamber based on a position information of the mass; and
    a summing junction connected to the feedforward control system and the feedback control system, the summing junction calculating the sum of the required pressure level from the feedforward control system and the feedback control pressure signal from the feedback control system;
    wherein the pressure control actuator uses the summed pressure level to control the pressure level in the compliance chamber.

14. A pneumatic control device of claim 13, wherein the position information of the mass is a position of a center of gravity of the mass.

15. A pneumatic control device to support a mass in a vibration isolation system, comprising:
   a compliance chamber filled with a fluid pneumatically supporting the mass, the fluid having a fluctuating pressure level due to vibration of the mass;
   a reference chamber filled with the fluid having a predetermined pressure level; and
   a differential pressure sensor connecting the compliance chamber to the reference chamber, and measuring a differential pressure level between the compliance chamber and the reference chamber,
   wherein the differential pressure level is used to control the fluctuating pressure level in the compliance chamber so that the fluctuating pressure level is substantially eliminated.

16. The pneumatic control device of claim 15, further comprising:
   a reference valve connected between the reference chamber and the compliance chamber, the reference valve being open during initiation to equalize the fluid pressure in the pneumatic control device, and being closed during operation.

17. The pneumatic control device of claim 15, further comprising:
   a feedback control system, connected to the differential pressure sensor, for receiving the differential pressure level and adjusting the pressure level in the compliance chamber; and
   a pressure control actuator, connected to the compliance chamber and the feedback control system, the pressure control actuator for controlling the pressure level in the compliance chamber so that the differential pressure level equals a desired value.

18. The pneumatic control device of claim 15, further comprising:
   a damping device connected to the compliance chamber and a fluid supply, the damping device controlling the fluid flowing into and out of the compliance chamber to reduce the fluctuating pressure level in the compliance chamber.

19. The pneumatic control device of claim 18, wherein the damping device comprises:
   a damping chamber filled with the fluid;
   a restriction connected to the compliance chamber and the damping chamber, the restriction for controlling the fluid flowing between the damping chamber and the compliance chamber so that the fluctuating pressure level is minimized; and
   a fluid supply regulator connected to the damping chamber and the fluid supply, the fluid supply regulator for controlling the fluid flowing between the damping chamber and the fluid supply so that the pressure level in the compliance chamber can be controlled.

20. A lithography system comprising a pneumatic control device as claimed in claim 15.

21. An object on which an image has been formed by the lithography system of claim 20.

22. A method for pneumatically controlling vibration of a mass caused by external disturbances, the mass being pneumatically supported by a compliance chamber filled with a fluid, the method comprising the steps of:
   directly measuring a pressure level in the compliance chamber; and
   controlling the pressure level to minimize the effects of fluctuating pressure level in the compliance chamber.

23. The method of claim 22, wherein the measuring step comprises:
   measuring an absolute pressure level in the compliance chamber.

24. The method of claim 22, wherein the measuring step comprises:
   measuring a differential pressure level between the compliance chamber and a reference chamber, the reference chamber having a predetermined pressure level.

25. The method of claim 22, wherein the controlling step comprises:
   actuating a pressure control actuator to control the fluid flowing into and out of the compliance chamber so that the pressure level in the compliance chamber equals a desired value.

26. The method of claim 22, further comprising a step of:
   determining a calculated pressure level required to compensate for the external disturbances; and
   determining a difference between the measured pressure level and the calculated pressure level to control the pressure level in the compliance chamber.

27. A method of operating an exposure apparatus to transfer a pattern of a reticle onto a substrate, the apparatus having a projection optical system, a first stage system arranged to be movable with respect to the projection optical system for mounting said reticle thereon, a second stage system arranged to be movable with respect to the projection optical system for mounting the substrate thereon, and a vibration isolation device that supports at least one of the projection optical system, the first stage system and the second stage system pneumatically by a compliance chamber, the method comprising:
   controlling the vibration isolation device by utilizing the method of claim 22 to control vibration of any of the system supported by the vibration isolation device.

28. A method for making an object on which an image has been formed by utilizing the method of operating an exposure apparatus of claim 27.

29. A pneumatic control device to support a mass in a vibration isolation system, comprising:
   a compliance chamber filled with a fluid to pneumatically support the mass;
   a pressure sensor connected to the compliance chamber, the pressure sensor measuring a pressure level in the compliance chamber and for outputting a pressure information of the compliance chamber;
   a feedback control system connected to the pressure sensor, the feedback control system receiving the pressure information and generating a feedback control pressure signal; and
   a pressure control actuator connected to the compliance chamber and the feedback control system, the pressure control actuator controlling the pressure level in the compliance chamber in response to the feedback control pressure signal,
   wherein the pressure control actuator comprises one of a bellows and a piston connected to the compliance chamber, and
   wherein the one of a bellows and a piston is connected to an electromagnetic actuator, the one of a bellows and a piston controlling a volume of the compliance chamber when the fluid pressure has a small amplitude and a high frequency variation.

* * * * *

UNITED STATES PATENT AND TRADEMARK OFFICE
CERTIFICATE OF CORRECTION

PATENT NO.     : 6,590,639 B1
DATED          : July 8, 2003
INVENTOR(S)    : Bausan Yuan et al.

It is certified that error appears in the above-identified patent and that said Letters Patent is hereby corrected as shown below:

<u>Title page,</u>
After the "*Assistant Examiner,*" insert -- [74] *Attorney, Agent, or Firm*
Finnegan, Henderson, Farabow, Garrett & Dunner, L.L.P. --.

Signed and Sealed this

Sixth Day of January, 2004

JAMES E. ROGAN
*Director of the United States Patent and Trademark Office*